(12) United States Patent
Waddell (10) Patent No.: US 11,344,922 B2
(45) Date of Patent: May 31, 2022

(54) SELF CLEANING ION GENERATOR DEVICE

(71) Applicant: Global Plasma Solutions, Inc., Savannah, GA (US)

(72) Inventor: Charles Houston Waddell, Roanoke, VA (US)

(73) Assignee: Global Plasma Solutions, Inc., Charlotte, NC (US)

( * ) Notice: Subject to any disclaimer, the term of this patent is extended or adjusted under 35 U.S.C. 154(b) by 483 days.

(21) Appl. No.: 16/272,147

(22) Filed: Feb. 11, 2019

(65) Prior Publication Data
US 2019/0247893 A1    Aug. 15, 2019

Related U.S. Application Data

(60) Provisional application No. 62/629,295, filed on Feb. 12, 2018.

(51) Int. Cl.
| | | |
|---|---|---|
| B08B 1/04 | (2006.01) | |
| H01T 23/00 | (2006.01) | |
| H01J 37/04 | (2006.01) | |
| B03C 3/74 | (2006.01) | |
| B01D 53/32 | (2006.01) | |

(52) U.S. Cl.
CPC ............... *B08B 1/04* (2013.01); *B01D 53/32* (2013.01); *B03C 3/743* (2013.01); *H01J 37/04* (2013.01); *H01T 23/00* (2013.01)

(58) Field of Classification Search
None
See application file for complete search history.

(56) References Cited

U.S. PATENT DOCUMENTS

| | | | |
|---|---|---|---|
| 1,811,687 A | 6/1931 | Goldberg et al. | |
| 3,624,448 A | 11/1971 | Saurenman | |
| 3,652,897 A | 3/1972 | Iosue | |
| 3,769,695 A | 11/1973 | Price | |

(Continued)

FOREIGN PATENT DOCUMENTS

| | | |
|---|---|---|
| AU | 2014214642 A1 | 8/2015 |
| CA | 2108790 A1 | 4/1995 |

(Continued)

OTHER PUBLICATIONS

"Products" Web Page, http://www.gpshvac.com/index.php?option=com_content&view=article&id=11&itemid=93, 1 page, Apr. 29, 2013, retrieved from Internet Archive Wayback Machine, https://web.archive.org/web/20130429232411/http://www.gpshvac.com/index.php?option=com_content&view=article&id=11&Itemid=93 on Jan. 20, 2017.

(Continued)

*Primary Examiner* — Ashok Patel (57) ABSTRACT

A self-cleaning ion generator device includes a first portion with a base portion that extends to an outer edge and a first pair and a second pair of opposed sidewalls extending upwardly from the outer edge and intersect at corners, forming a cavity therein. A second portion includes a base portion that extends to an outer edge selectively secured to the first portion forming a housing. At least one ion emitting device extending from the housing, and at least one cleaning apparatus for cleaning the at least one ion emitting device.

17 Claims, 7 Drawing Sheets

(56) References Cited

U.S. PATENT DOCUMENTS

| | | |
|---|---|---|
| 3,968,405 A | 7/1976 | Testone |
| 4,031,599 A | 6/1977 | Testone |
| 4,117,326 A | 9/1978 | Askman |
| D253,281 S | 10/1979 | Kim |
| 4,216,518 A | 8/1980 | Simons |
| 4,263,636 A | 4/1981 | Testone |
| 4,264,343 A | 4/1981 | Natarajan |
| 4,284,420 A | 8/1981 | Borysiak |
| D286,765 S | 11/1986 | Prouty et al. |
| 4,734,580 A | 3/1988 | Rodrigo et al. |
| 4,757,422 A | 7/1988 | Bossard et al. |
| 4,809,127 A | 2/1989 | Steinman et al. |
| 4,829,398 A | 5/1989 | Wilson |
| 5,034,651 A | 7/1991 | Domschat |
| 5,084,077 A | 1/1992 | Junker et al. |
| D332,942 S | 2/1993 | Julien |
| D353,575 S | 12/1994 | Macomber |
| 5,492,557 A | 2/1996 | Vanella |
| 5,653,638 A | 8/1997 | Nagata |
| 5,737,176 A | 4/1998 | Muz |
| 5,741,352 A | 4/1998 | Ford et al. |
| 5,768,087 A | 6/1998 | Vernitskiy |
| 5,879,435 A | 3/1999 | Satyapal |
| 5,931,989 A | 8/1999 | Knutsson |
| 6,019,815 A | 2/2000 | Satyapal |
| 6,118,645 A | 9/2000 | Partridge |
| D434,523 S | 11/2000 | Ford |
| 6,156,099 A | 12/2000 | Hironaka et al. |
| D443,587 S | 6/2001 | Sakasegawa |
| 6,252,756 B1 | 6/2001 | Richie, Jr |
| 6,330,146 B1 | 12/2001 | Blitshteyn |
| 6,417,581 B2 | 1/2002 | Hall |
| 6,350,417 B1 | 2/2002 | Lau et al. |
| 6,464,754 B1 | 10/2002 | Ford |
| 6,544,485 B1 | 4/2003 | Taylor |
| D476,298 S | 6/2003 | Lee |
| 6,576,046 B2 | 6/2003 | Pruette |
| 6,680,033 B2 | 1/2004 | Ishii |
| 6,744,611 B2 | 6/2004 | Fujii |
| 6,791,814 B2 | 9/2004 | Adachi et al. |
| 6,850,403 B1 | 2/2005 | Gefter et al. |
| 6,855,190 B1 | 2/2005 | Nikkhah |
| 6,902,392 B2 | 6/2005 | Johnson |
| D533,832 S | 12/2006 | Hock |
| 7,177,133 B2 | 2/2007 | Riskin |
| 7,244,289 B2 | 7/2007 | Su |
| 7,256,979 B2 | 8/2007 | Sekoguchi et al. |
| 7,273,515 B2 | 9/2007 | Yuen |
| 7,408,759 B2 | 8/2008 | Getter et al. |
| D587,198 S | 2/2009 | Nagasawa |
| 7,492,568 B2 | 2/2009 | Takayanagi |
| 7,497,898 B2 | 3/2009 | Sato et al. |
| 7,639,472 B2 | 12/2009 | Sekoguchi |
| 7,716,772 B2 | 5/2010 | Shih et al. |
| 7,739,771 B2 | 6/2010 | Powell, Jr. |
| 7,764,482 B2 | 7/2010 | Lee et al. |
| 7,824,477 B2 | 11/2010 | Kang et al. |
| 7,916,445 B2 | 3/2011 | Sekoguchi |
| 7,940,509 B2 | 5/2011 | Orihara et al. |
| 7,948,733 B2 | 5/2011 | Hashimoto |
| 7,961,451 B2 | 6/2011 | Sekoguchi |
| 7,969,707 B2 | 6/2011 | Riskin |
| 7,995,321 B2 | 8/2011 | Shimada |
| 8,043,573 B2 | 10/2011 | Parker et al. |
| 8,053,741 B2 | 11/2011 | Sekoguchi |
| 8,106,367 B2 | 1/2012 | Riskin |
| 8,134,821 B2 | 3/2012 | Fukai |
| 8,328,902 B2 | 12/2012 | Boyden et al. |
| 8,425,658 B2 | 4/2013 | Lee |
| 8,564,924 B1 | 10/2013 | Waddell et al. |
| 8,710,455 B2 | 4/2014 | Klochkov |
| 8,724,286 B2 | 5/2014 | Uchida et al. |
| 8,861,168 B2 | 10/2014 | Waddell et al. |
| 8,951,024 B2 | 2/2015 | Ishii |
| 8,957,571 B2 | 2/2015 | Riskin |
| 9,293,895 B2 | 3/2016 | Pucciani |
| D754,314 S | 4/2016 | Ellis et al. |
| 9,579,664 B2 | 2/2017 | Marra |
| 9,623,422 B2 | 4/2017 | Overdahl |
| 9,630,185 B1 | 4/2017 | Riskin |
| 9,630,186 B2 | 4/2017 | Back |
| 9,646,806 B2 | 5/2017 | Jang |
| 9,660,425 B1 | 5/2017 | Sunshine |
| 9,661,725 B2 | 5/2017 | Gefter |
| 9,661,727 B2 | 5/2017 | Gefter |
| 9,847,623 B2 | 12/2017 | Sunshine |
| 9,849,208 B2 | 12/2017 | Waddell |
| 9,859,090 B2 | 1/2018 | Gefter |
| 9,948,071 B2 | 4/2018 | Chen et al. |
| 9,985,421 B2 | 5/2018 | Sunshine |
| 10,020,180 B2 | 7/2018 | Waddell |
| 10,116,124 B2 | 10/2018 | Sung |
| 10,153,623 B2 | 12/2018 | Sunshine |
| 10,258,922 B2 | 4/2019 | Hsieh |
| D848,945 S | 5/2019 | Lin |
| 10,297,984 B2 | 5/2019 | Sunshine |
| 10,322,205 B2 | 6/2019 | Waddell |
| 10,439,370 B2 | 10/2019 | Sunshine |
| 10,492,285 B2 | 11/2019 | Lee |
| 10,566,769 B2 | 2/2020 | Waddell |
| 10,695,455 B2 | 6/2020 | Waddell |
| 10,710,098 B2 | 7/2020 | Marra |
| 10,737,279 B2 | 8/2020 | Gefter et al. |
| 10,758,947 B2 | 9/2020 | Heymann et al. |
| 10,786,818 B2 | 9/2020 | Galbreath et al. |
| 2003/0072697 A1 | 4/2003 | Taylor |
| 2003/0147783 A1 | 8/2003 | Taylor |
| 2006/0193100 A1 | 8/2006 | Izaki et al. |
| 2007/0253860 A1 | 11/2007 | Schroder |
| 2008/0130190 A1 | 6/2008 | Shimada |
| 2008/0160904 A1 | 7/2008 | Yl et al. |
| 2009/0052108 A1 | 2/2009 | Innami |
| 2009/0211459 A1 | 8/2009 | Hu et al. |
| 2010/0172808 A1 | 1/2010 | Garashi |
| 2010/0157503 A1 | 6/2010 | Saito |
| 2010/0175391 A1 | 7/2010 | Jee et al. |
| 2012/0068082 A1 | 3/2012 | Noda |
| 2012/0154973 A1 | 6/2012 | Vaynerman et al. |
| 2014/0076162 A1 | 3/2014 | Waddell et al. |
| 2014/0078639 A1 | 3/2014 | Waddell et al. |
| 2014/0103793 A1 | 4/2014 | Nishida et al. |
| 2014/0147333 A1 | 5/2014 | Morfill |
| 2014/0233232 A1 | 8/2014 | Radermacher |
| 2015/0255961 A1 | 9/2015 | Chen et al. |
| 2016/0167059 A1 | 6/2016 | Waddell |
| 2016/0175852 A1 | 6/2016 | Waddell |
| 2017/0040149 A1 | 2/2017 | Waddell |
| 2017/0232131 A1 | 8/2017 | Waddell |
| 2017/0274113 A1 | 9/2017 | Takasahara et al. |
| 2018/0040466 A1 | 2/2018 | Waddell |
| 2018/0071426 A1 | 3/2018 | Waddell |
| 2018/0169711 A1 | 6/2018 | Waddell |
| 2019/0353359 A1 | 11/2019 | Seibold |
| 2020/0161839 A1 | 5/2020 | Waddell |
| 2020/0388994 A1* | 12/2020 | Waddell ............... B03C 3/82 |

FOREIGN PATENT DOCUMENTS

| | | |
|---|---|---|
| CN | 107138028 A | 9/2017 |
| CN | 111228535 A | 6/2020 |
| DE | 3735219 A1 | 4/1989 |
| DE | 10355834 A1 | 7/2005 |
| DE | 202006006549 U1 | 8/2007 |
| DE | 102009035066 A1 | 3/2010 |
| DE | 102008062415 A1 | 7/2010 |
| DE | 202020102021 U1 | 4/2020 |
| EP | 0919287 A2 | 6/1999 |
| EP | 1878506 A2 | 1/2008 |
| EP | 2336665 A1 | 6/2011 |
| EP | 2411058 A1 | 2/2012 |
| EP | 2683042 A2 | 1/2014 |
| EP | 2905036 A1 | 8/2015 |
| EP | 3093564 A1 | 11/2016 |
| EP | 3165833 A1 | 5/2017 |

(56) References Cited

FOREIGN PATENT DOCUMENTS

| | | |
|---|---|---|
| EP | 3346560 A1 | 7/2018 |
| FR | 1494344 A | 9/1967 |
| GB | 1356211 A | 6/1974 |
| GB | 2117676 A | 10/1983 |
| GB | 2117676 A1 | 10/1983 |
| GB | 2245200 A | 1/1992 |
| GB | 2301179 A | 11/1996 |
| GB | 2377660 A | 1/2003 |
| GB | 2415774 A | 1/2006 |
| GB | 2525280 A | 10/2015 |
| GB | 2529173 A | 2/2016 |
| JP | 2681623 B2 | 11/1996 |
| JP | 2002-043092 A | 2/2002 |
| JP | 2004-006152 A | 1/2004 |
| JP | 2009-043580 A | 2/2009 |
| JP | 4778289 B2 | 9/2011 |
| JP | 5094492 B2 | 12/2012 |
| JP | 2017-098139 A | 6/2017 |
| KR | 100776572 B1 | 11/2007 |
| KR | 101589055 B1 | 1/2016 |
| KR | 20160138931 A | 12/2016 |
| KR | 10-1800326 B1 | 12/2017 |
| KR | 10-1816255 B1 | 1/2018 |
| WO | 8700089 A1 | 1/1987 |
| WO | 9820588 A1 | 5/1998 |
| WO | WO 2006/039147 A2 | 4/2006 |
| WO | WO 2007/009336 A1 | 1/2007 |
| WO | 2007131981 A1 | 11/2007 |
| WO | WO 2010/014654 A1 | 2/2010 |
| WO | WO 2010/140434 A1 | 12/2010 |
| WO | WO 2011/136735 A1 | 11/2011 |
| WO | 2012176099 A1 | 12/2012 |
| WO | 2013173528 A1 | 11/2013 |
| WO | WO 2014/047445 A1 | 3/2014 |
| WO | 2015052557 A1 | 4/2015 |
| WO | 2015101348 A1 | 7/2015 |
| WO | 2015111853 A1 | 7/2015 |
| WO | 2015138802 A1 | 9/2015 |
| WO | WO 2016/000411 A1 | 1/2016 |
| WO | WO 2016/082730 A1 | 6/2016 |
| WO | WO 2016/134204 A1 | 8/2016 |
| WO | WO 2016/147127 A1 | 9/2016 |
| WO | 2016204688 A1 | 12/2016 |
| WO | 2017022255 A1 | 2/2017 |
| WO | 2017067341 A1 | 4/2017 |
| WO | WO 2017/085954 A1 | 5/2017 |
| WO | 2017155458 | 9/2017 |
| WO | WO 2017/152693 A1 | 9/2017 |
| WO | WO 2017/155458 A1 | 9/2017 |
| WO | 2017168800 A1 | 10/2017 |
| WO | WO 2017/168800 A1 | 10/2017 |
| WO | 2018175828 A1 | 9/2018 |
| WO | 2018189924 A1 | 10/2018 |
| WO | WO 2018/234633 A1 | 12/2018 |
| WO | 2019000694 A1 | 1/2019 |
| WO | WO 2019/108898 A1 | 6/2019 |
| WO | 2020037851 A1 | 2/2020 |
| WO | 2020056855 A1 | 3/2020 |
| WO | 2020078284 A1 | 4/2020 |
| WO | WO 2020/158967 A1 | 8/2020 |
| WO | WO 2020/186576 A1 | 9/2020 |
| WO | 2020218247 A1 | 10/2020 |
| WO | WO 2020/218247 A1 | 10/2020 |

OTHER PUBLICATIONS

"RGF Environmental Air Purification Technologies—Guardian Air HVAC Cell" Web Page, http://www.airstarsolutions.com/Pages/RGFguardian.aspx,3 pages, Aug. 20, 2012, retrieved from Internet Archive Wayback Machine, https://web.archive.org/web/20120820000149/http://www.airstarsolutions.com/Pages/RGFguardian.aspx on Jan. 20, 2017.

Pushpawala Buddhi, et al., "Efficiency of Ionizers in Removing Airborne Particles in Indoor Environments." Journal of Electrostatics, vol. 90, pp. 79-84, Dec. 2017.

Wang, Wei, et al., "Assessment of Indoor Air Quality Using Different Air-Condition for Cooling." Advanced Materials Research, vol. 518-523, pp. 910-913, May 2012.

Wang, Yun Han, et al., "Research Progress of Air Purifier Principles and Material Technologies." Advanced Materials Research, vol. 1092-1093, pp. 1025-1028, Mar. 2015.

K. Nishikawa and H. Nojima, "Air purification technology by means of cluster ions generated by discharge plasma at atmospheric pressure." The 30th International Conference on Plasma Science, 2003. ICOPS 2003. IEEE Conference Record—Abstracts, pp. 379-, 2003.

Airmaid By Interzon product brochure; Sep. 2016; Interzon AB,Propellervagen 4A,SE-183 62 Taby, Sweden www.airmaid.com.

Extended European Search Report dated Sep. 28, 2021, in European Application No. 19750315.4, 60 pages.

Global Plasma Solutions. Link: https://gpshvac.com/wp-content/uploads/2017/07/GPS-FC48-AC-IOM-Rev-.pdf Visited Jul. 5, 2019. GPS-FC48-AC-IOM-Rev Self-Cleaning Ion Generator Device. (Year: 2019).

* cited by examiner

SELF CLEANING ION GENERATOR DEVICE

CROSS REFERENCE TO RELATED PATENT APPLICATION

The present patent application/patent claims the benefit of priority of U.S. Provisional Patent Application No. 62/629,295, filed on Feb. 12, 2018, and entitled "SELF CLEANING ION GENERATOR DEVICE," the contents of which are incorporated in full by reference herein.

FIELD OF THE INVENTION

The present invention relates generally to the field of air treatment, and more particularly to the treatment of air using ionization that has a self-cleaning mechanism for cleaning the emission portion of an ionization device without having to remove the device from the conduit or duct that has a thin profile and a protective grate encircling the electrodes and cleaning assembly.

BACKGROUND OF THE INVENTION

Air and other fluids are commonly treated and delivered for a variety of applications. For example, in heating, ventilation and air-conditioning (HVAC) applications, air may be heated, cooled, humidified, dehumidified, filtered or otherwise treated for delivery into residential, commercial or other spaces.

Needs exist for improved systems and methods of treating and delivering air for these and other applications. It is to the provision of improved systems and methods meeting these needs that the present invention is primarily directed.

BRIEF SUMMARY OF THE INVENTION

According to an embodiment of the present invention a self-cleaning ion generator device includes a first portion with a base portion that extends to an outer edge and a first pair and a second pair of opposed sidewalls extending upwardly from the outer edge and intersect at corners, forming a cavity therein. A second portion includes a base portion that extends to an outer edge selectively secured to the first portion forming a housing. At least one ion emitting device extending from the housing, and at least one cleaning apparatus for cleaning the at least one ion emitting device.

According to another embodiment of the present invention, a self-cleaning ion generator device includes a grate surrounding the at least one ion emitting device and the at least one cleaning apparatus.

According to yet another embodiment of the present invention, the at least one cleaning apparatus is powered by a motor housed within the cavity.

According to yet another embodiment of the present invention, a self-cleaning ion generator device that includes at least one ion emitting device has a top portion and a bottom portion, wherein the top portion extends above the housing and the bottom portion is disposed within the cavity of the housing.

According to yet another embodiment of the present invention, a self-cleaning ion generator device that includes at least two emission portions spaced apart and extending from the housing.

According to yet another embodiment of the present invention, a self-cleaning ion generator device that includes at least one cleaning head disposed on the at least one cleaning apparatus for cleaning the at least one ion emitting device.

According to yet another embodiment of the present invention, a self-cleaning ion generator device that includes at least one ion emitting device includes an ion emitting device with a plurality of bristles.

BRIEF DESCRIPTION OF THE DRAWINGS

The present invention is illustrated and described herein with reference to the various drawings, in which like reference numbers denote like method steps and/or system components, respectively, and in which.

DETAILED DESCRIPTION OF THE INVENTION

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Any and all patents and other publications identified in this specification are incorporated by reference as though fully set forth herein.

Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

Referring now specifically to the drawings, a self-cleaning ion generator device is illustrated in FIGS. 1, 2, 3, 5, and 6 and is shown generally at reference numeral 10. The device 10 includes a housing 12 having a first portion 14 and a second portion 16. The first portion 14 may be rectangular and is selectively secured to the second portion 16, which may also be rectangular. The first portion 14 contains a base portion 18 that extends to an outer edge and a first pair of opposed sidewalls 20 and a second pair of opposed sidewalls 22 extend upward from the outer edge. The first pair of opposed sidewalls 20 and the second pair of opposed sidewalls 22 intersect at corners forming a cavity 24 therein.

The second portion 16 has a base portion 26 that extends to an outer edge. A lip 28 extends upwardly from the base portion 26 and extends around the periphery of the base portion 26. The lip 28 is off-set a predetermined distance from the outer edge of the base portion 26. In other words, the lip 28 extends upwardly from the base portion 26 and is not engaged to the outer edge of the base portion 26, but is disposed a distance from the outer edge on the base portion 26.

Figure 2:
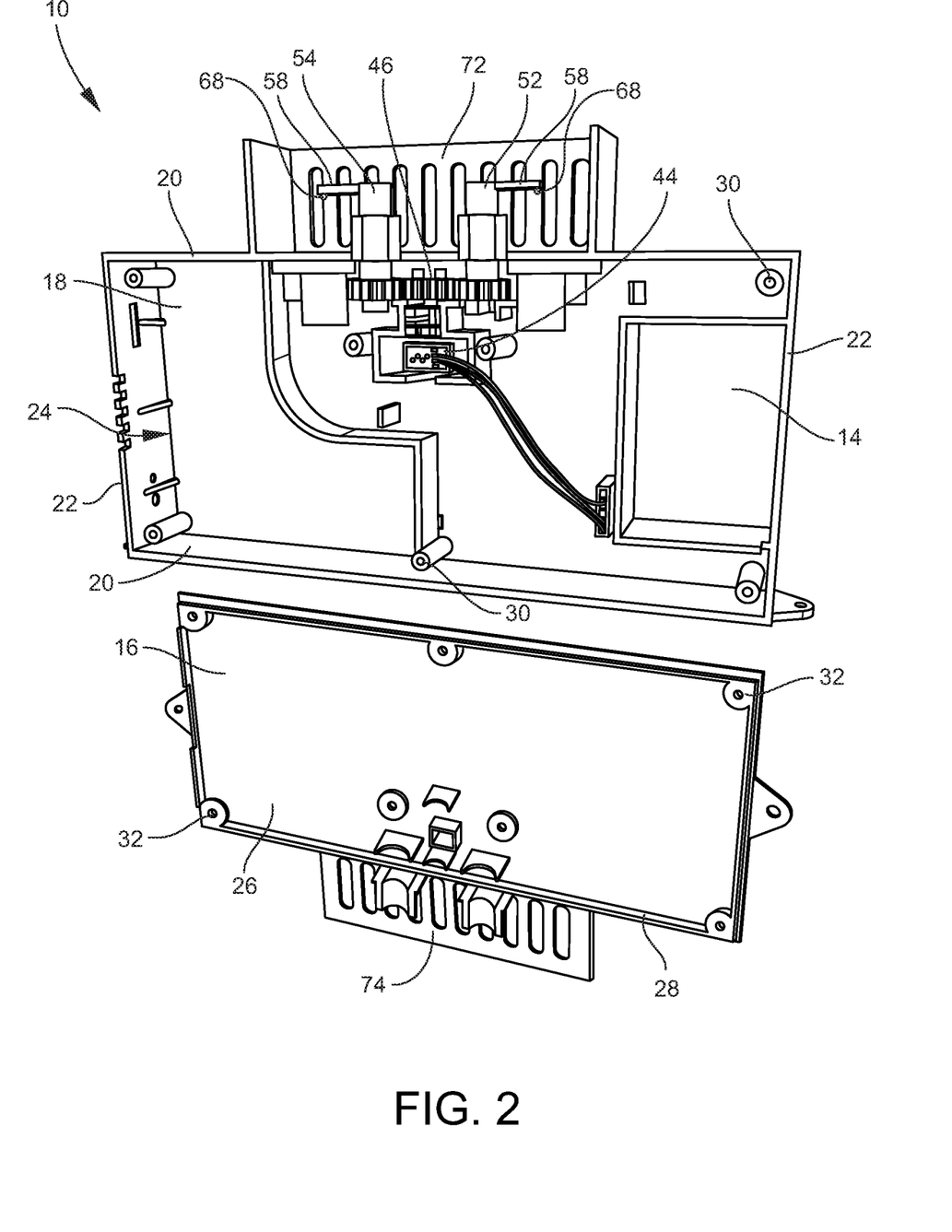
FIG. 2 is an internal view of the self-cleaning ion generator device.
Figure 3:
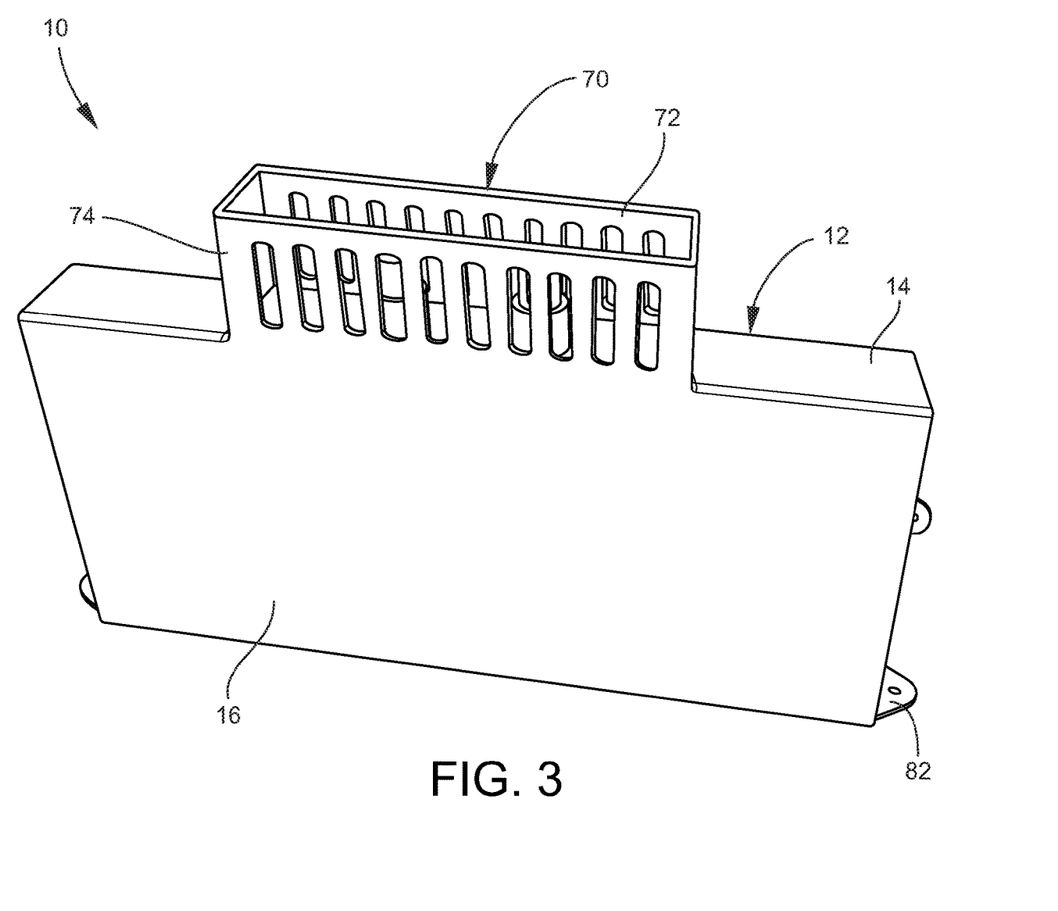
FIG. 3 is a perspective view of the self-cleaning ion generator device.
Figure 4:
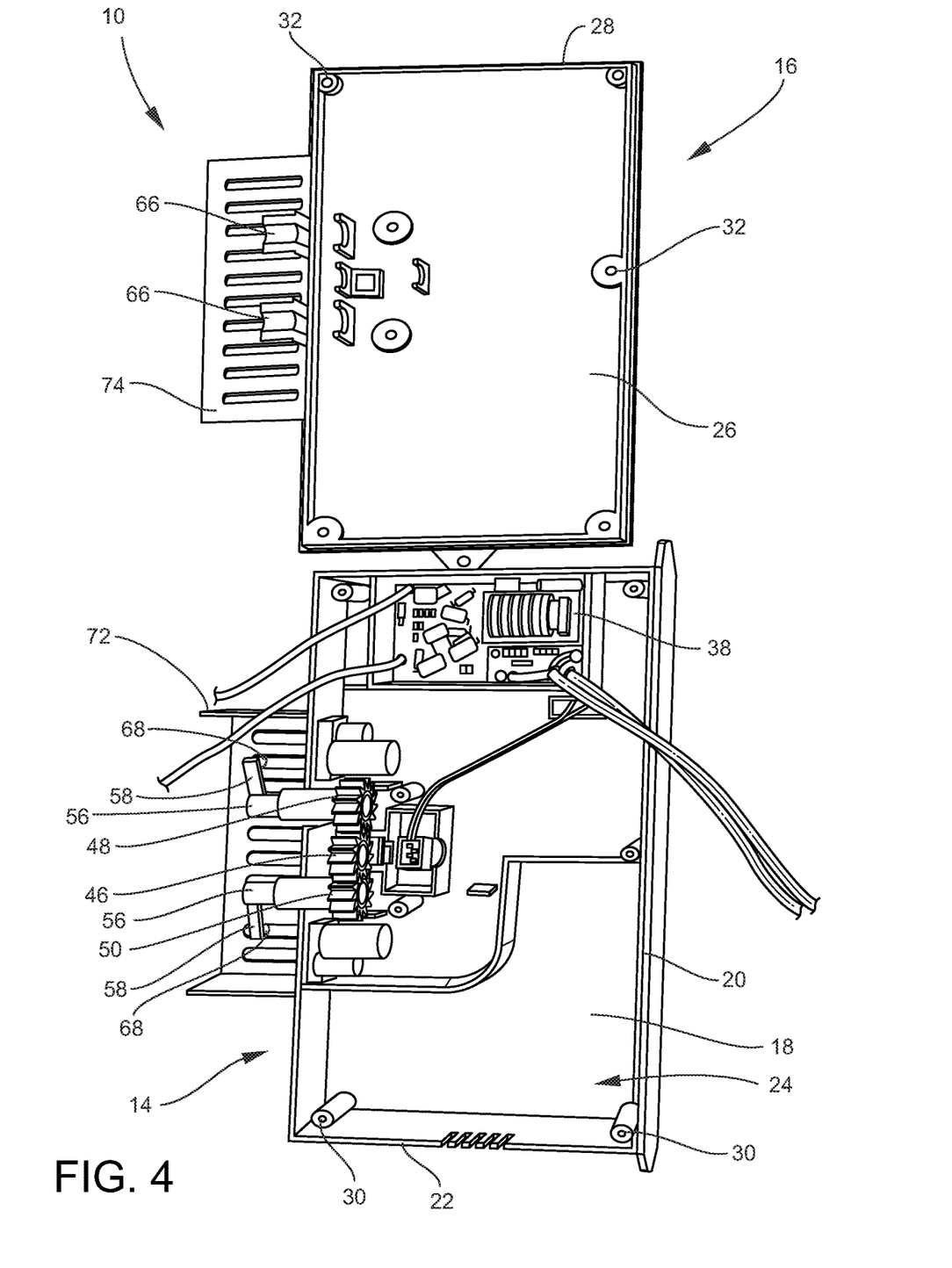
FIG. 4 is another internal view of the self-cleaning ion generator device.
Figure 5:
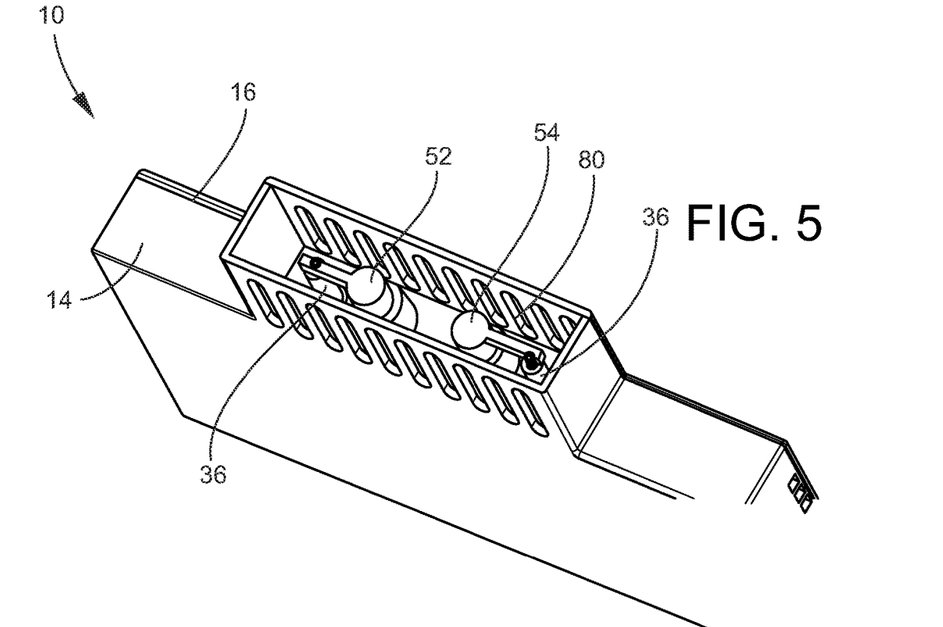
FIG. 5 is a perspective view of the self-cleaning ion generator device.
Figure 6:
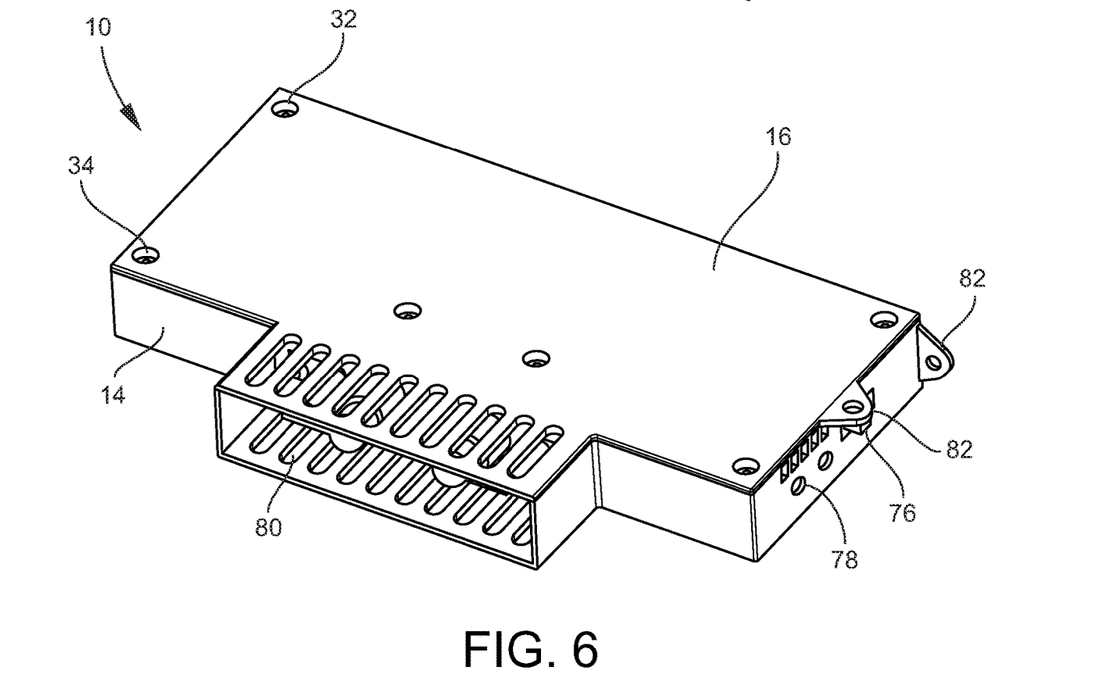
FIG. 6 is a perspective view of the self-cleaning ion generator device.
Figure 7:
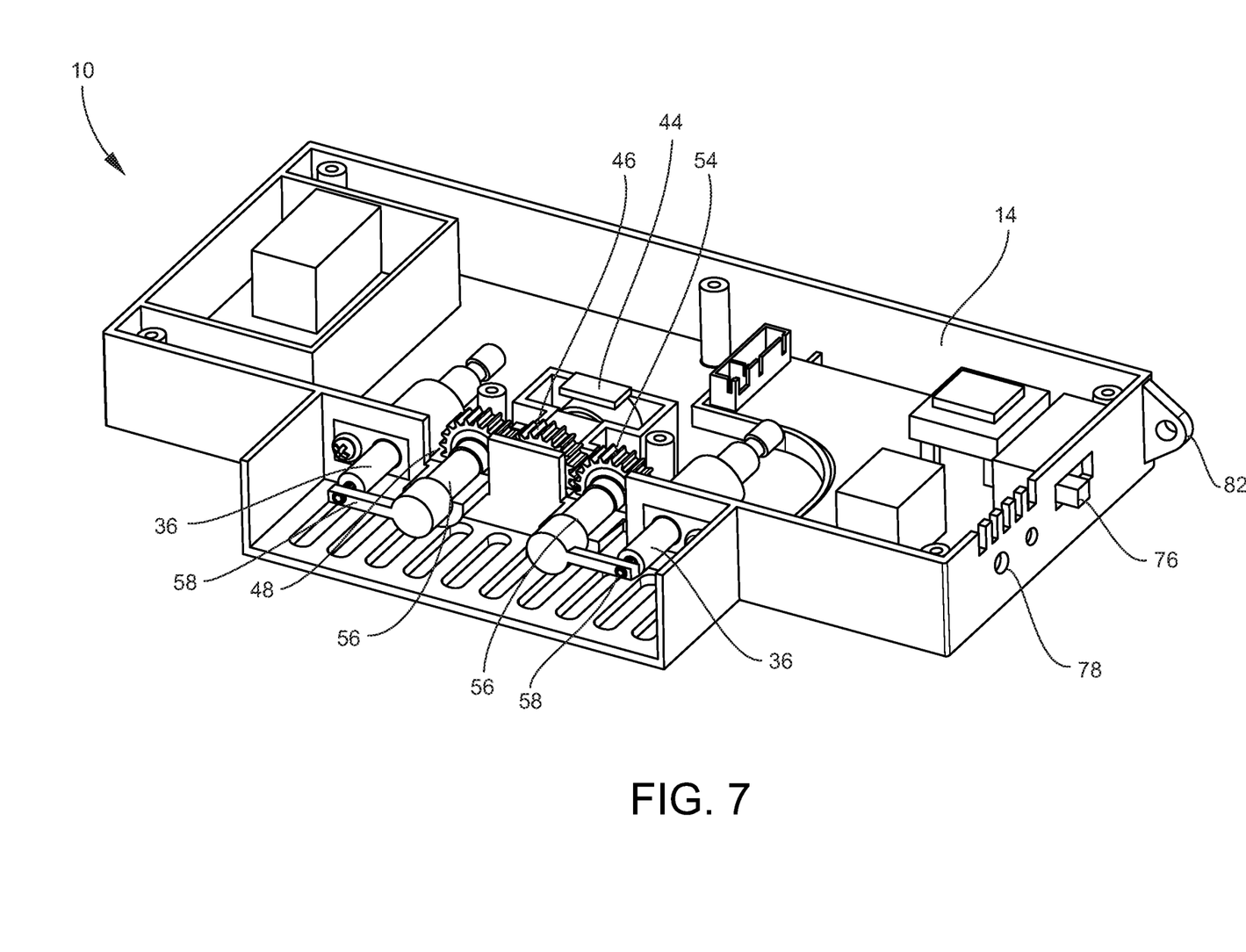
FIG. 7 is an internal view of the self-cleaning ion generator device.

At least one cylindrical bore 30 is engaged to the base portion 18 of the first portion 14 and extends upwardly from the base portion 18. As illustrated in FIGS. 2 and 4, a cylindrical bore 30 is disposed adjacent each corner and extending upwardly from the base portion 18 of the first portion 14. Additional cylindrical bores 16 may be disposed near the central portion of the base portion 18 and extending upwardly therefrom. The cylindrical bores 30 extend to a predetermined height, and as illustrated, extend to the height substantially similar to the height of the first pair of opposed sidewalls 20 and the second pair of opposed sidewalls 22.

Figure 8:
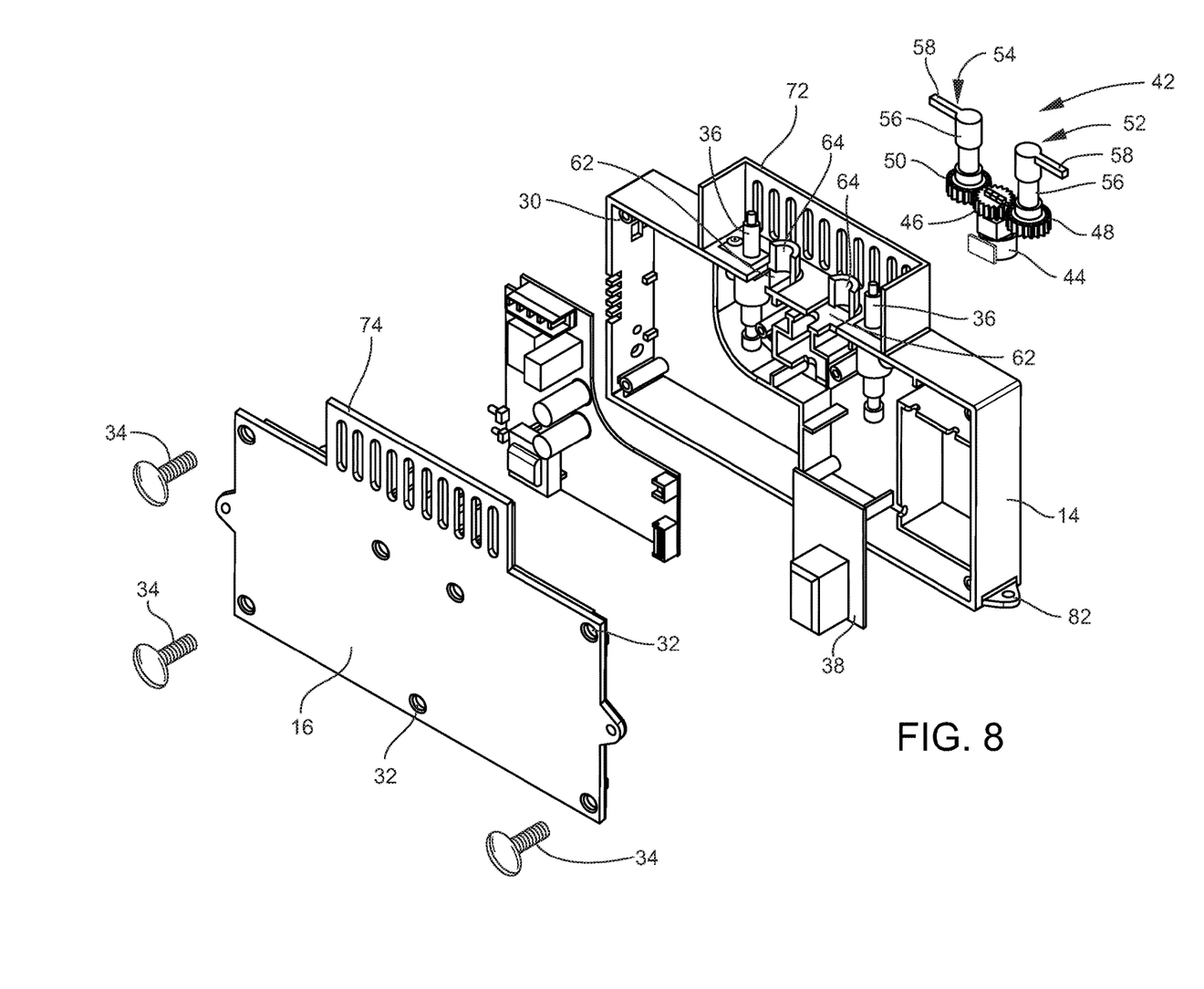
FIG. 8 is an exploded view of the self-cleaning ion generator device.

A corresponding hole 32 is positioned on the second portion 16 that extends from the top side to the bottom side of the base portion 26. When the second portion 16 is placed over top the first portion 14, the hole 32 is above the cylindrical bore 30 for inserting a fastening device 34, such as a screw, bolt, etc. for selectively securing the first portion 14 to the second portion 16, as illustrated in FIG. 8.

At least one ion emitter device 36, as shown in FIGS. 2, 4, 7, and 8, is positioned within the cavity 24 and is electrically and communicatively coupled to a circuit board 38. As illustrated, the device 10 contains two spaced-apart ion emitter devices 36. The circuit board 38 is contained within the cavity 24 and engaged to the first portion 14. The circuit board 38 may include a power supply source for providing power to the device 10. The power supply provides the electricity to power the ion emitter device 36, and thus, produces ions. The ion emitter device 36 contains an emission portion that is any element capable of emitting ions, such as needles or brushes. As illustrated in the figures, the ion emitter device 36 contains a top portion and a bottom portion. The top portion of the ion emitter device 36 extends outward from the device 10, and specifically outwardly from a sidewall of the first portion 14 and second portion 16 when the first portion 14 and the second portion 16 are in the combined configuration. The top portion contains the emission portion for emitting ions. The bottom portion of the ion emitter device 36 is disposed within the cavity 24 and electrically coupled to the circuit board 38 that is electrically coupled to the power supply. Alternatively, the bottom portion of the ion emitter device 36 may be electrically coupled directly to the power supply.

The emission portion of the ion emitter device 36 may be a needle or a brush. The needle contains an elongate portion that narrows to a point at one end. In other words, the needle has a bottom portion and a top portion. The bottom portion has a width larger than the top portion, wherein the top portion defines a point for allowing ions to emit therefrom. Alternatively, the emission portion may contain a brush that has a plurality of bristles that extend outwardly away from the brush. The brush and its bristles may be made of any material that conducts electricity and the combination of the brush with its bristles and the high voltage wire or electrode may be collectively referred to herein as an electrode. In one embodiment, the bristles of the brush are composed of a thermoplastic polymer imbedded with conductive material that allows the polymer to conduct electricity. For example, the bristles of the brush may be composed of polypropylene or polyethylene and impregnated with carbon. Generally, the bristles of the brush may contain between about 20 to about 80 wt % polypropylene copolymer or polyethylene copolymer, between about 5 to about 40 wt % talc, and from about 5 to 40 wt % carbon black. However, any other resistive, inductive, reactive or conductive plastic or non-metallic material may be utilized for the bristles of the brush. The brushes are replaceable and allowed to be easily disengaged and new bristles may be inserted and retained.

A cleaning assembly 42 is positioned within the device 10. As shown in FIG. 8, the cleaning assembly 42 includes a motor 44, a drive gear 46, a first slave gear 48, a second slave gear 50, a first cleaning apparatus 52, and a second cleaning apparatus 54. The motor 44 is preferably a DC stepper motor that rotates the drive gear 46. The drive gear 46 is engaged to a first slave gear 48 and a second slave gear 54. The teeth of the drive gear 46 interconnection with the teeth of the first slave gear 48 and the second slave gear 54. As the drive gear 46 rotates, it rotates the first slave gear 48 and the second slave gear 50. The first slave gear 48 and the second slave gear 50 are disposed on opposite sides of the drive gear 46. The first cleaning apparatus is engaged to first slave gear 48. The second cleaning apparatus 54 is engaged to the second slave gear 50.

The first cleaning apparatus 52 contains an elongate portion 56 that extends outwardly from the first slave gear 48. The second cleaning apparatus 54 contains an elongate portion 56 that extends outwardly from the second slave gear 50. A cleaning portion 58 is disposed on the first and second cleaning apparatuses (52, 54). The cleaning portion 58 extends outward from the elongate portion 56 such that it can contact the top portion of the respective ion emitter devices 36.

Figure 1:
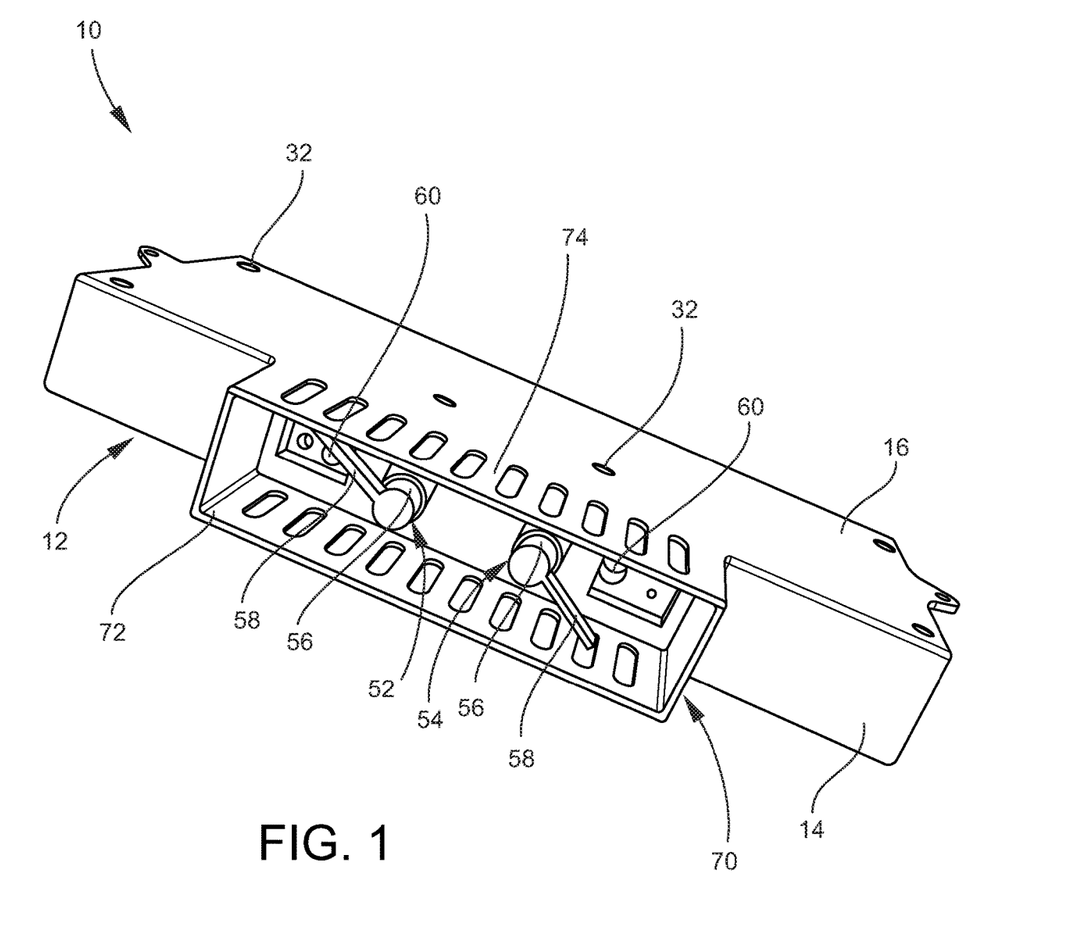
FIG. 1 is a perspective view of the self-cleaning ion generator device.

An upper sidewall of the first portion 14 and the second portion 16 may contain at least one bore 60, and as illustrated in FIG. 1, the upper end may contain at least two bores 60. The upper sidewall is one sidewall of the first pair of opposed sidewalls 20 or the second pair of opposed sidewalls 22. The bores 60 extend from the inner side to the exterior side of the upper sidewall. The ion emitting devices 36 extend through the bores 60 with the top portion extending above the bore 60 and the bottom portion extending below the bore 60.

As illustrated in FIG. 4, a first high voltage wire engages one of the ion emitting devices 36 and a second high voltage wire engages the other ion emitting device 36 for providing electricity to produce the ions from the top portion of the ion emitter device 36.

Two spaced-apart openings 62 are disposed within the upper sidewall of the first portion 14. As shown in FIGS. 2, 4, 7, and 8, the openings contain a u-shaped portion formed within the upper sidewall that is open on one side. When the second portion 16 is engaged to the first portion 14, the base portion 26 serves to enclose the open side. As shown in FIGS. 2 and 8, a first arcuate portion 64 extends upwardly above the openings 62 on the first portion 14. The first arcuate portions 64 are adjacent the bottom portion of the u-shaped opening 62 and extend upwardly from the opening 62. A pair of second arcuate portions 66 are disposed on the second portion 16. As illustrated in FIG. 2, the second arcuate portions 66 are disposed adjacent the upper edge of the second portion 16. When the first portion 14 and second portion 16 are selectively secured, the first arcuate portions 64 and the second arcuate portions 66 form a circular collar that extends upwardly from the openings 62. When selectively secured, the circular collar is hollow and completely encircles the opening 62 and extends perpendicularly upward from the upper sidewall. As shown in FIG. 2, the circular collar formed by the engagement of the first arcuate portion 64 and the second arcuate portion 66 encircles the elongate portion 56 of the cleaning assembly 42. As shown in FIG. 2, the motor 44, drive gear 46, first slave gear 48, and second slave gear 50 are positioned within the cavity 24 of the device 10. The first portion of the elongate portion 56 is also positioned within the cavity 24, but extends through the opening 62 and above the upper edge of the circular collar formed by the engagement of the first arcuate portion 64 and the second arcuate portion 66.

A cleaning head 68 is disposed on the cleaning portion 58 for contacting and cleaning the emission portion of the ion emitter device 36. Preferably, the cleaning head 68 is removable and replaceable. The cleaning head 68 may contain any device that may clean the emission portion of the ion emitter device 36, such as a brush, cloth, foam pad, etc.

The circuitry of the circuit board 38 may also include a timing circuit for timing the motor 44 for engagement or activation at a predetermined time. The drive gear 46 is powered by the motor 44 and is operationally connected to a timing circuit that activates the motor 44 at a predetermined interval. By way of example only, the drive gear 46 may be activated between every 12 to 24 hours, thus rotating the first slave gear 48 and the second slave gear 50 that rotates the first cleaning apparatus 52 and the second cleaning apparatus 54 for cleaning the emission portion of the ion emitter devices 36. While the cleaning apparatuses (52,54) are activated, the device 10 ceases to produce ions, thus preventing any loose particles from sticking to the cleaning heads 68.

A grate 70 is disposed on one side of the device 10. The grate 70 has a first side 72 and a second side 74. The first side 72 of the grate 70 is disposed on the exterior side of the upper sidewall. The first side 72 has a first end portion and a second end portion that are spaced-apart from each other and extend along the face of the exterior side of a sidewall. A first face portion of the grate 70 extends along the length of a sidewall and the first side of the face portion engages an end of the first end portion. The second side of the first face portion engages an end of the second end portion. Preferably, the first and second end portions are solid, and the first face portion has a plurality of longitudinally extending slots 80 extending from the interior side to the exterior side of the first face portion, allowing air to flow through the first face portion.

A second face portion extends from the upper edge of a side of the base portion 26 of the second portion 16. The second face portion is configured identically to the first face portion with a plurality of longitudinally extending slots 80 extending from the interior side to the exterior side of the second face portion, allowing air to flow through the second face portion. When the first portion 14 and second portion 16 are engaged to each other, a first end of the second face portion is engaged to an end of the first end portion and the second end of the second face portion is engaged to an end of the second end portion. When the first side 72 and the second side 74 of the grate 70 are engaged to each other, the grate 70 is rectangular shaped and encloses the ion emitter devices 36 and the first cleaning apparatus 52 and the second cleaning apparatus 54. The top side of the grate 70 is open. The grate 70 is wide enough to allow the cleaning portion 58 to make a complete rotation around the elongate portion 56.

In an alternative embodiment of the present invention, the device 10 includes an alarm feature, including alarm contacts, that are communicatively coupled to a building management system that sends a signal to the building management system if ions are not produced by the device 10. The building management system then sends an alert informing a user that the device 10 is not producing ions. A test button 76 may also be located on the device 10 to check the motor status during preventive maintenance and a light 78, such as a light-emitting diode (LED) light, may be illuminated, indicating a cleaning test is being conducted. A light, such as an LED light, is illuminated and indicating power is being supplied to the device 10, The device 10 may produce approximately equal amounts of positive and negative ions, regardless of airflow velocity or other conditions such as humidity or temperature. In example forms, the device 10 produces positive ions and negative ions in a concentration of at least about 200 million ion/cc, and operates on 24 VAC, 110 VAC or 200 VAC to 240 VAC without the use of an external transformer. In alternate embodiments, the device generates negative ions only, or positive ions only, or generate negative ions and positive ions in unequal quantities. The device 10 optionally utilizes nano-electronic components allowing the device to be very compact, requiring less than 10 watts/ion generator module. The bottom portion 12 may contain terminals extending therefrom for connecting the 24 VAC, 110-240 VAC, and neutral input.

The device 10 may be positioned and secured in place within a conduit or the housing of the air handler unit, such as a duct, such that the emission portion is aligned generally perpendicularly to the direction of the airflow across the device 10, to prevent recombination of the positively charged ions with the negatively charged ions. The device 10 may include attachment devices 82 with a centrally located bore for receiving an attachment device, allowing the device to be secured in place. The device 10 may be mounted in a conduit within a variable refrigerant flow HVAC system, including ducted and ductless units.

The treatment of air by delivery of bipolar ionization to an airflow within a conduit according to the systems and methods of the present invention may be utilized for various purposes. For example, application of bipolar ionization to an airflow within an HVAC conduit such as an air handler housing or duct may be utilized to abate allergens, pathogens, odors, gases, volatile organic compounds, bacteria, virus, mold, dander, fungus, dust mites, animal and smoke odors, and/or static electricity in a treated air space to which the airflow is directed. Ionization of air in living and working spaces may reduce building related illness and improve indoor air quality; and additionally, can reduce the quantity of outside air needed to be mixed with the treated indoor air, reducing heating and cooling costs by enabling a greater degree of air recirculation.

During use, once power is provided to the device 10, the device 10 initiates an internal check on all systems. After initializing and the check has confirmed all systems are operational, an LED light 78 will blink "on" proving the device has been powered. The device 10 also contains a test button 76 that when pushed, initiates a cleaning cycle of the device 10, causing the motor 44 to engage, thus rotating the drive gear 46, and causing the first and second cleaning apparatuses (52,54) to rotate and clean the emission portion of the ion emitter devices 36.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A self-cleaning ion generator device, comprising:
a housing including a first portion with a base portion that extends to an outer edge of the housing, and a first pair and a second pair of opposed sidewalls extending upwardly from the outer edge and intersecting at corners of the housing, forming a cavity therein,
the housing further including a second portion with a base portion that extends to an outer edge selectively secured to the first portion forming the housing;
at least one ion emitting device extending from the housing; and
at least one cleaning apparatus for cleaning the at least one ion emitting device.

2. The self-cleaning ion generator device of claim 1, further comprising a grate surrounding the at least one ion emitting device and the at least one cleaning apparatus.

3. The self-cleaning ion generator device of claim 1, further comprising a motor housed within the cavity of the housing and configured to power the cleaning apparatus.

4. The self-cleaning ion generator device of claim 1, wherein the at least one ion emitting device has a top portion and a bottom portion, wherein the top portion extends above the housing and the bottom portion is disposed within the cavity of the housing.

5. The self-cleaning ion generator device of claim 1, further comprising at least two ion emitting devices spaced apart and extending from the housing.

6. The self-cleaning ion generator device of claim 1, further comprising at least one cleaning head disposed on the at least one cleaning apparatus for cleaning the at least one ion emitting device.

7. The self-cleaning ion generator device of claim 1, wherein the at least one ion emitting device includes a plurality of bristles extending therefrom.

8. The self-cleaning ion generator device of claim 1, wherein the first portion contains a first side grate extending upwards from one of the sidewalls and the second portion contains a second side grate extending upwards from one of the sidewalls, wherein when the first portion and the second portion are selectively secured together the first side grate and the second side grate protect the at least one ion emitter device and at least one cleaning apparatus.

9. The self-cleaning ion generator device of claim 1, wherein the housing includes attachment devices configured to mount the ion emitting device within the housing.

10. The self-cleaning ion generator device of claim 1, wherein the at least one cleaning apparatus is configured to rotate to clean the at least one ion emitting device.

11. The self-cleaning ion generator device of claim 10, wherein the at least on ion emitting device is a brush formed of bristles at its terminal end.

12. A self-cleaning ion generator device, comprising:
a housing including a first portion with a base portion that extends to an outer edge of the housing, and a first pair and a second pair of opposed sidewalls extending upwardly from the outer edge and intersecting at corners of the housing, forming a cavity therein,
the housing further including a second portion with a base portion that extends to an outer edge selectively secured to the first portion forming the housing;
a first ion emitting device and a second ion emitting device extending from the housing; and
a cleaning assembly including a first cleaning apparatus for cleaning the first ion emitting device, and a second cleaning apparatus for cleaning the second ion emitting device.

13. The self-cleaning ion generator device of claim 12, wherein the base portion of the second portion contains a lip extending outwardly from the base portion.

14. The self-cleaning ion generator device of claim 12, wherein the cleaning assembly includes a motor engaged to a gear on the first cleaning apparatus and a gear on the second cleaning apparatus for rotating the first cleaning apparatus and the second cleaning apparatus.

15. The self-cleaning ion generator device of claim 12, wherein the at least one emission portion is selectively secured to device for producing ions disposed within the housing.

16. A self-cleaning ion generator device, comprising:
a housing having a generally rectangular first portion with a base portion that extends to an outer edge of the housing and a first pair and a second pair of opposed sidewalls extending upwardly from the outer edge and intersecting at corners of the housing, forming a cavity therein,
the housing further including a generally rectangular second portion with a base portion that extends to an outer edge selectively secured to the first portion forming the housing;
a first ion emitting device and a second ion emitting device extending from the housing;
a cleaning assembly including a first cleaning apparatus for cleaning the first one ion emitting device, and a second cleaning apparatus for cleaning the second ion emitting device; and
a drive gear rotationally connected to a first slave gear engaged to the first cleaning apparatus and a second slave gear engaged to the second cleaning apparatus.

17. The self-cleaning ion generator device of claim 16, further comprising a circuit board within the cavity.

* * * * *